United States Patent [19]

Bailey

[11] 4,443,701

[45] Apr. 17, 1984

[54] INTEGRATING IR DETECTOR IMAGING SYSTEMS

[75] Inventor: Gary C. Bailey, Burbank, Calif.

[73] Assignee: The United States of America as represented by the Administrator of the National Aeronautics and Space Administration, Washington, D.C.

[21] Appl. No.: 296,137

[22] Filed: Aug. 25, 1981

[51] Int. Cl.$^3$ .......................... G01J 1/00; H01J 31/49
[52] U.S. Cl. ..................................... 250/332; 250/338
[58] Field of Search ............... 250/330, 332, 334, 338, 250/339, 347, 352; 357/30; 358/113

[56] References Cited

U.S. PATENT DOCUMENTS

| | | | |
|---|---|---|---|
| 3,806,729 | 4/1974 | Caywood | 250/339 |
| 3,808,435 | 4/1974 | Bate et al. | 250/332 |
| 4,054,797 | 10/1977 | Milton et al. | 250/332 |
| 4,363,963 | 12/1982 | Ando | 357/30 |

*Primary Examiner*—Janice A. Howell

*Attorney, Agent, or Firm*—John R. Manning; Paul F. McCaul; Thomas H. Jones

[57] ABSTRACT

An integrating IR detector array for imaging is provided in a hybrid circuit with InSb mesa diodes (1, 2 . . . 128) in a linear array, a single J-FET preamplifier (30) for readout, and a silicon integrated circuit multiplexer (34). A reset switch (32) is also provided to reset (charge) all of the diodes to a predetermined level at the end of each line scan. Thin film conductors in a fan-out pattern deposited on an Al$_2$O$_3$ substrate (42) connect the diodes to the multiplexer, and thick film conductors also connect the reset switch and preamplifier to the multiplexer. Two-phase clock pulses ($\phi_1$ and $\phi_2$) are applied with a logic return signal to the multiplexer through a triax comprised of three thin film conductors deposited one over the other with silicate glass insulation between layers. A lens (14) focuses a scanned image onto the diode array for horizontal read out one line at a time while a scanning mirror (22) provides vertical scan. A cooler (20) maintains the hybrid circuit at a very low (liquid nitrogen) temperature.

4 Claims, 5 Drawing Figures

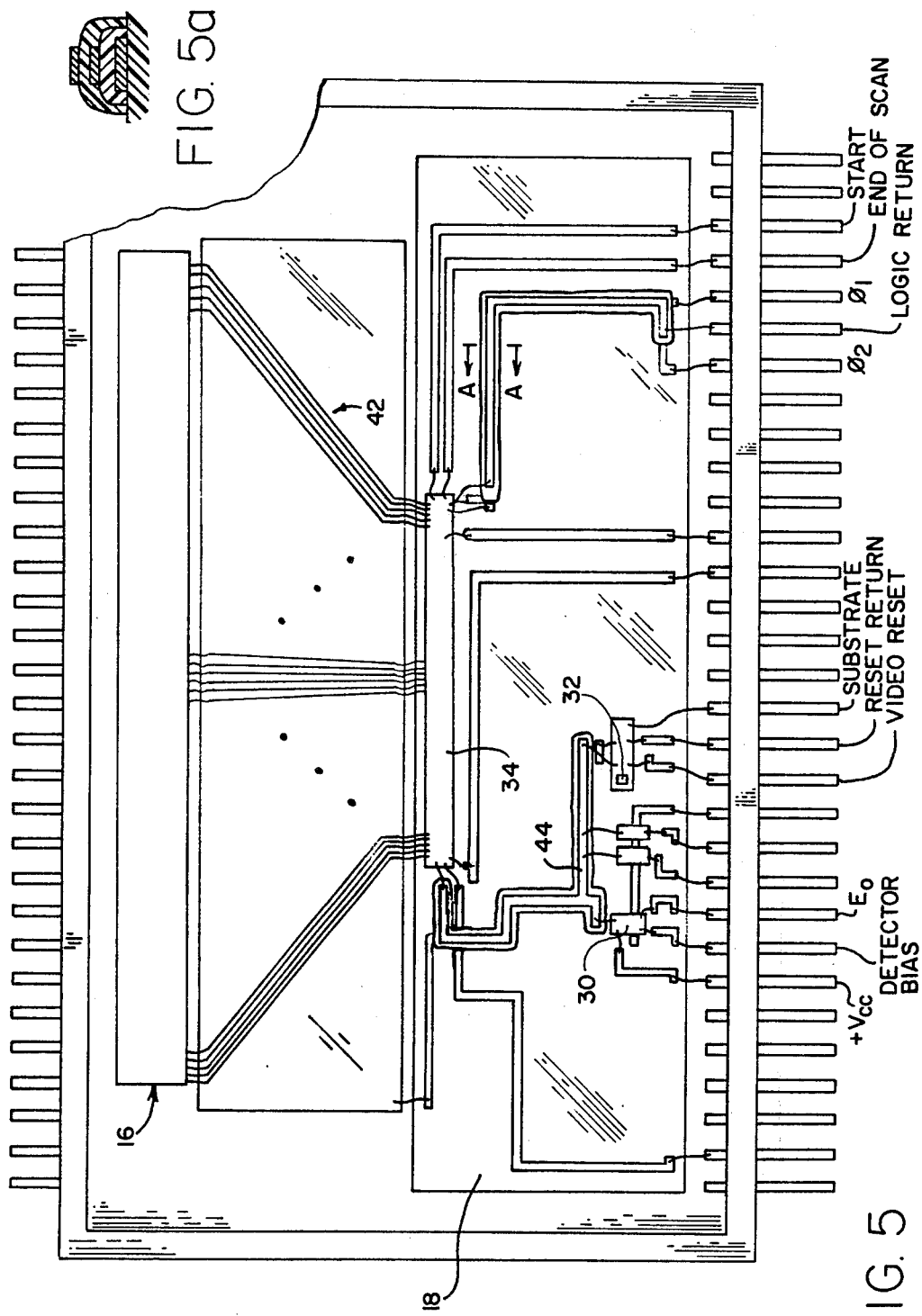

INTEGRATING IR DETECTOR IMAGING SYSTEMS

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435; 42 USC 2457).

BACKGROUND OF THE INVENTION

This invention relates to an array of infrared (IR) detectors for imaging, and more particularly to a compact multiplexed array of integrating IR detectors for imaging.

Missions like Galileo to Jupiter in 1985 have created a need for a compact multiplexed array of integrating detectors for a near infrared imaging instrument. The objective is to provide an array of very high quality detectors in a focal plane assembly of about $1\frac{3}{4}'' \times 1''$ in area, and less than $\frac{1}{8}''$ in height, in which charge integration is accomplished in the detectors. Commercial applications may include medical diagnostics, thermal studies of electronic circuitry and integrated circuits and intrusion and surveillance detection.

SUMMARY OF THE INVENTION

These and other objects of the invention are achieved by a linear array of high quality photovoltaic InSb detector diodes, each capable of photocurrent charge integration in the diode junction capacitance, combined with an integrated FET multiplexer in a hybrid circuit formed on a substrate of nonconductive material. Connector pins, extending from an enclosing package for external input and output signals, are connected to the detector array, on integrated multiplexing circuit and other circuitry, namely a reset FET switch for the multiplexing circuit and a preamplifier FET for the output. The detector diodes are connected by thin film conductors deposited on the substrate to the multiplexing circuit, and other circuitry. Drive signals for the multiplexing circuit are applied through a triax deposited on the substrate as a first thin film conductor coated by an insulator, a second thin film conductor over the first, also coated by an insulator and a third thin film coated by an insulating material. Opposing (180° out of phase) squarewave clock signals are applied to the first and third conductors for synchronous operation of the multiplexing circuit, and a logic signal return is applied to the second (inner) conductor.

The novel features that are considered characteristic of this invention are set forth with particularity in the appended claims. The invention will best be understood from the following description when read in connection with the accompanying drawings.

BRIEF DESCRIPTION OF THE DRAWINGS

FIG. 5 shows the topology of a hybrid circuit implementation of the circuit diagram shown in FIG. 4, and FIG. 5a shows a cross section taken along a line A—A in FIG. 5.

DESCRIPTION OF PREFERRED EMBODIMENTS

Figure 1:
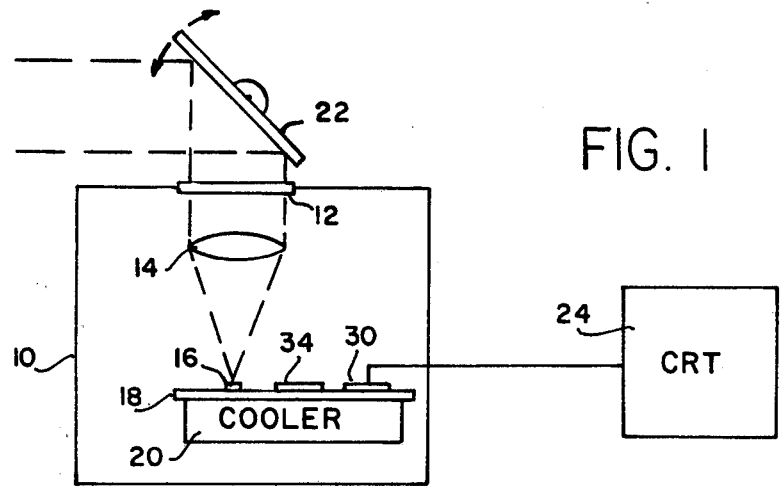
FIG. 1 is a schematic diagram of an infrared imaging instrument in which the present invention is to be practiced.

A near infrared (IR) mapping spectrograph instrument shown schematically in FIG. 1 is comprised of a housing 10 with a window 12 and lens 14 for focusing an IR (0.6 to 5.4 microns) image on a linear array 16 of mesa photovoltaic indium antimonide (InSb) diodes mounted on a hybrid circuit board 18. These InSb diodes are produced using mesa fabrication technology so that it is possible to accomplish photocurrent charge integration right on the diode junction capacitance. The circuit board is thermally connected to a cooler 20. The circuit board 18 (shown in FIG. 5) includes an FET multiplexer for reading the integrated charges in sequence to produce one horizontal line of image at a time as a mirror 22 scans vertically. To successfully integrate charge on the diode junction capacitance, the multiplexer must have a leakage resistance in its off state much higher than the detector diode leakage resistance. Images produced by this system can be reproduced through a cathode ray tube (CRT) 24.

When cooled to liquid nitrogen temperatures, the multiplexer has a leakage resistance greater than $10^{12}$ ohms. The multiplexer operates normally at liquid nitrogen temperatures (78° K.). Because the InSb diodes typically have a junction resistance of about $10^{10}$ ohms at liquid nitrogen temperatures, the multiplexer with its $10^{12}$ ohm "off" resistance allows integration times approaching one second with low background conditions (less than $10^{10}$ photons/sec/cm$^2$). Thus, the key to obtaining useful charge storage in InSb diodes is low leakage paths on the diode surface and good diode characteristics (sharp breakdown knee and high reverse breakdown voltage). InSb mesa diodes made by Cincinnati Electronics display both of these characteristics.

Figure 3:
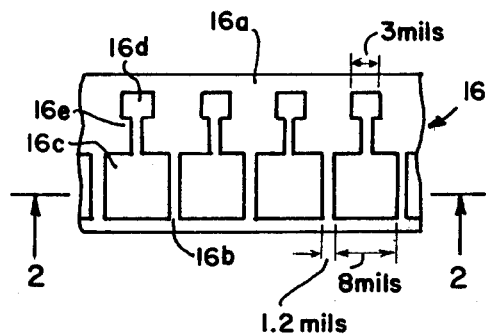
FIG. 3 is a plan view of the portion of the array of detector diodes shown in FIG. 2.
Figure 2:
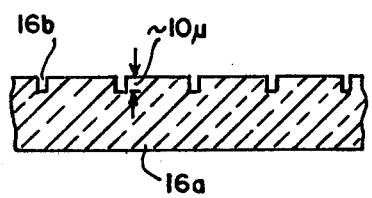
FIG. 2 is a cross section of a portion of an array of InSb detector diodes illustrating the mesa diode structure.

FIG. 2 illustrates a portion of an array of 128 mesa diodes formed on a substrate 16a with channels 16b to a depth of about 10 microns to leave an array of 8×8 mil mesa diodes 16c, each with a bonding pad 16d that is 3×3 mils connected by narrow strips 16e, as shown in FIG. 3. The substrate 16a is simply the base InSb material.

Useful charge integration has been achieved in high quality photovoltaic InSb diodes when combined with a FET multiplexing circuit. An exemplary detector assembly with a linear array of 128 InSb diodes coupled to a FET multiplexer will now be described with reference to FIGS. 4 and 5. A J-FET preamplifier 30, MOS FET reset switch 32, silicon integrated circuit multiplexer 34, and the InSb array 16 are contained on a thick film hybrid microcircuit board 18 of Al$_2$O$_3$. The board dimensions are 1.75"×1.0"×0.015". A low noise preamplifier topology is utilized, as shown in FIG. 5. It capitilizes on the low video line (44) capacitance inherent with hybrid fabrication techniques.

Figure 4:
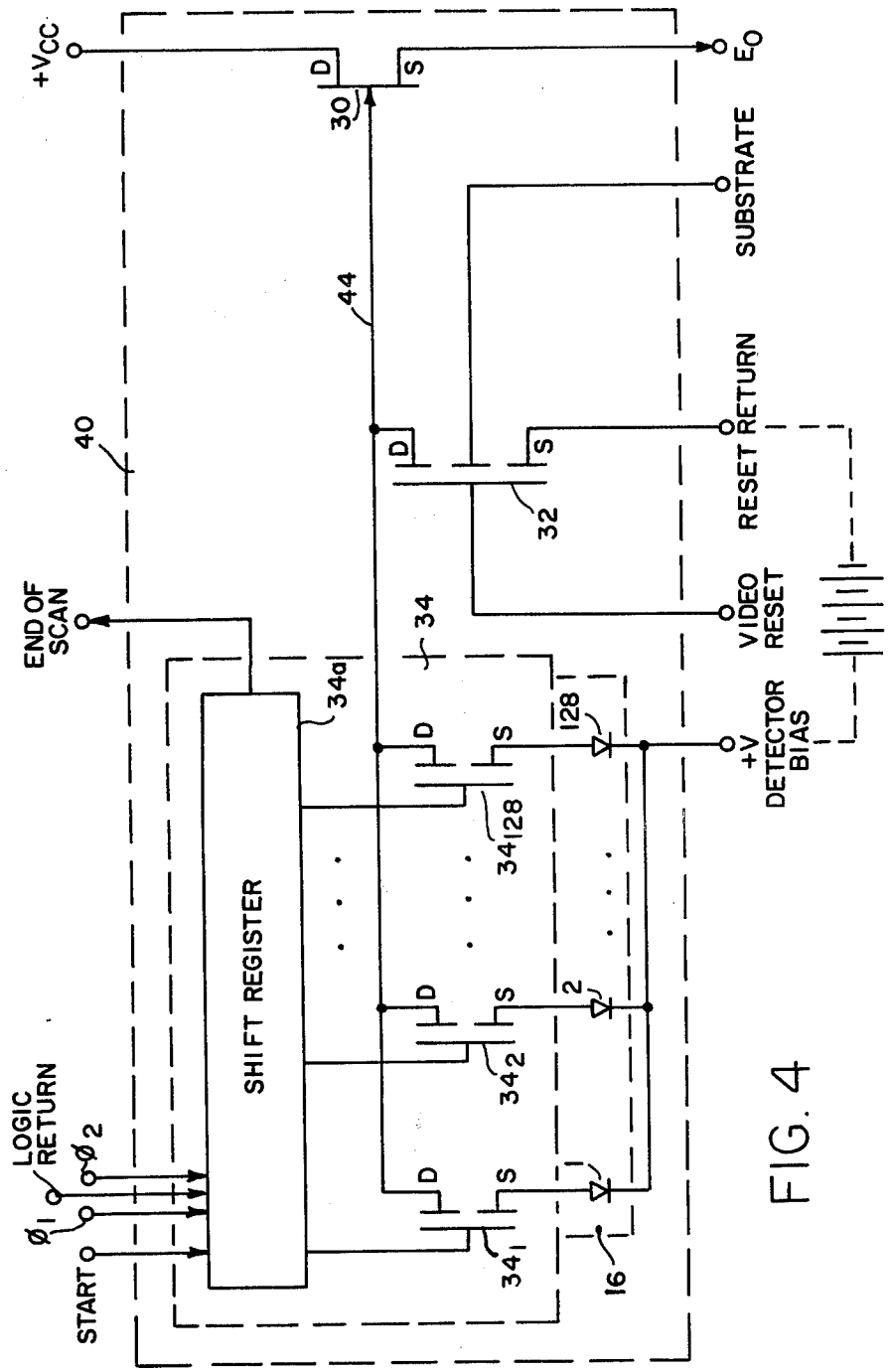
FIG. 4 is a circuit diagram of the focal plane assembly contained in the instrument of FIG. 1.

For convenience, the components just identified with reference to the circuit diagram of FIG. 4 are identified by the same reference numerals in FIG. 5. All of these components are placed in a standard 22-pin integrated circuit package 40. A thin film fan-out 42 connects the anodes of the diodes of the array 16 to the multiplexer 34. All of these diodes are connected through their substrate to a pin for back bias voltage (+V). A video line 44 connects the output of the multiplexer 34 to the gate of the J-FET preamplifier 30. The source of that preamplifier is connected to one of the 22 package pins, while the drain is connected to a source of bias voltage $V_{cc}$ through another pin. The video line 44 is also connected to the drain of the MOS FET reset switch 32. The source of that MOS FET is connected to the voltage return for the detector bias via package pins. A video reset signal applied to the gate of the MOS FET 32 resets (charges) all of the diodes 1 through 128 to a predetermined level after each pixel is read out from individual InSb diodes through MOS FET gates $34_1$, $34_2 \ldots 34_{128}$.

To operate the multiplexer $\phi_1$ and $\phi_2$ clock pulses step a bit 1 entered into a shaft register 34a by a START signal. The three lines for the logic return and two clock signals are applied through package pins connected to the silicon multiplexer by a triax comprised of a thin film conductor coated with an insulating material (silicate glass) for one phase clock. A thin film conductor directly over the insulated first conductor, also coated with the same insulating material, and a third thin film conductor directly over the other two, as shown in FIG. 5a which is a cross section of the triax along a line A—A in FIG. 5. This triax on the thick film substrate provides a faraday shield to reduce coupling switching transients into the video output. The topology features low power dissipation (less than 5 mW for up to 256 diodes), a small number of electrical connections (fourteen) that is not dependent on the number of elements, and compact package size.

Photovoltaic InSb diodes using mesa fabrication technology, have emerged as the only developed IR photodetectors in the 0.6 to 5.4 micron region that is not plagued with either gold migration problems (lifetime) or uncontrollable surface leakage (reproducibility). Taken in this light, InSb is the only narrow bandgap detector material that can be considered seriously for the near-IR advanced focal plane assemblies being contemplated by this invention.

InSb detectors fabricated with true mesa technology have reached a state of development where it is possible to accomplish photocurrent charge integration right on the diode junction capacitance. This accomplishment is now possible because of the development of devices with both high reverse breakdown voltages (2–3V) and nonexistent voltage dependent surface leakage.

The ability to provide charge integration in the photodetector itself is of great practical value. Since the photocharge is integrated right where it is produced, the inevitable loss associated with charge transfer to another location for integration is eliminated. Another virtue of the process is the attainment of a large ($\simeq 1 \times 10^7$ electron) charge storage/integration capability for each pixel. This characteristic is of great importance for IR applications because of the large dynamic range inherent in planetary and astrophysical IR sources.

For large linear arrays to be practical (such as 256 or 512 diodes), a readout technology is required to interface the detector array to the readout system that does not require a preamp for each pixel. It is desirable to do this with a small number of connections, so as to minimize thermal input to the array. To accomplish this task, the present invention employs a well developed commercial silicon multiplexer manufactured by Reticon Corporation. This device has 128 inputs, utilizes MOS fabrication, and can be operated at low temperatures down to 4° K. The architecture of this device is simply a series of MOS FET's $34_1, 34_2 \ldots 34_{128}$ that sequentially connect respective InSb diodes $1, 2 \ldots 128$ to a common output line, as shown in FIG. 4.

In this application, the multiplexer can be operated at the same temperature as the InSb diode array, thereby allowing a simplified thermal design within the housing. Because the multiplexer is silicon, the off resistance of the individual switches is several order of magnitude higher than the detector junction at a given temperature and therefore introduces no measurable effects on the product of the detector junction resistance and area (RoA).

The problem of switching transient noise appearing in the video output line is virtually eliminated because the InSb diode capacitance is about twice that of the video line. Also the triaxial clock drive scheme and faraday shielding built into the hybrid substrate provide a very effective means to prevent the high level clock drives (about 12V. P-P) from coupling into the low level video output. This approach is successful in eliminating switching transient and odd-even phase noise.

The linear imager thus described has been subjected to a number of tests to determine performance levels. The initial results indicate a device characterized by low dark current fixed pattern (dark uniformity) noise, high QE (typically 80%) and very uniform responsivity from element to element (2%). In order to gain an impression of the overall quality of this invention from an imaging point of view, a simple electronic camera system comprised of lens 14 and a scan mirror 22 for one deflection axis was employed, as shown in FIG. 1. A mosaic of IR images produced by the electronic camera was successfully produced on a CRT monitor. An image without modulation was produced by removing Z axis drive from the CRT monitor to demonstrate the raster-generated fixed pattern noise due to insufficient precision in the digital conversions (10 bits) used to generate the deflection ramps. The resulting images did not require any form of computer processing be applied to them. Even still, small temperature differences are resolvable ($\sim 0.05°$) indicating substantial promise for resolving the predicted system NE$\Delta$t of 0.01° K. with only modest processing of image data.

A demonstration that the invention in fact does integrate charge has been shown with integration times of 2.28, 3.28, and 4.28 msec. (line time of 1.28 msec plus adjustable integration periods at left edge of photo). The output response was found to be proportional to the total integration time.

Although particular embodiments of the invention have been described and illustrated herein, it is recognized that modifications and variations may readily occur to those skilled in the art. Consequently, it is intended that the claims be interpreted to cover such modifications and equivalents.

What is claimed is:

1. An integrating IR detector imaging system including a housing for said system and means for cooling said system to a very low temperature during operation, said system comprising
   a plurality of InSb mesa diodes in an array fabricated from a single substrate, thereby enhancing diode junction capacitance for the purpose of providing for photocurrent charge integration on the diode junction capacitance of said mesa diodes, means for focusing an IR image onto said diodes,
multiplexing means for reading out an integrated IR detected signal, one diode at a time, said multiplexing means being comprised of a silicon integrated circuit having much higher leakage resistance in its off state than the leakage resistance of said InSb mesa diodes, and amplifying means connected to said multiplexing means.

2. A system as defined in claim 1 wherein said amplifying means is a junction field-effect transistor.

3. A system as defined in claim 2, including a reset means for recharging all of said diodes to a predetermined level after reading out each image line.

4. A system as defined in claim 3 wherein said reset means is comprised of an MOS field-effect transistor.

* * * * *